United States Patent
Consoli et al.

(10) Patent No.: US 11,183,787 B2
(45) Date of Patent: Nov. 23, 2021

(54) ELECTRICAL CONNECTOR AND CONNECTOR SYSTEM HAVING PLATED GROUND SHIELDS

(71) Applicant: TE CONNECTIVITY CORPORATION, Berwyn, PA (US)

(72) Inventors: John Joseph Consoli, Harrisburg, PA (US); Rodney Ivan Martens, Mechanicsburg, PA (US); Chad William Morgan, Carneys Point, NJ (US); Suvrat Bhargava, Middletown, PA (US)

(73) Assignee: TE CONNECTIVITY SERVICES GmbH, Schaffhausen (CH)

( * ) Notice: Subject to any disclaimer, the term of this patent is extended or adjusted under 35 U.S.C. 154(b) by 468 days.

(21) Appl. No.: 16/145,913

(22) Filed: Sep. 28, 2018

(65) Prior Publication Data
US 2020/0106202 A1 Apr. 2, 2020

(51) Int. Cl.
| | |
|---|---|
| *H01R 13/03* | (2006.01) |
| *H01R 13/514* | (2006.01) |
| *H01B 1/02* | (2006.01) |
| *H01R 13/6471* | (2011.01) |
| *H01R 13/6587* | (2011.01) |
| *H01R 43/20* | (2006.01) |
| *H05K 9/00* | (2006.01) |
| *H05K 3/24* | (2006.01) |

(52) U.S. Cl.
CPC ............ *H01R 13/03* (2013.01); *H01B 1/026* (2013.01); *H01R 13/514* (2013.01); *H01R 13/6471* (2013.01); *H01R 13/6587* (2013.01); *H01R 43/20* (2013.01); *H05K 3/243* (2013.01); *H05K 3/247* (2013.01); *H05K 9/0084* (2013.01); *H05K 9/0088* (2013.01); *H05K 2201/0341* (2013.01)

(58) Field of Classification Search
None
See application file for complete search history.

(56) References Cited

U.S. PATENT DOCUMENTS

| | | | | |
|---|---|---|---|---|
| 2,926,124 | A | * | 2/1960 | Taylor ...................... C25D 3/60 |
| | | | | 205/252 |
| 4,049,508 | A | * | 9/1977 | Morrissey ................ C25D 3/60 |
| | | | | 205/252 |
| 4,870,227 | A | * | 9/1989 | Saen ...................... H01R 4/029 |
| | | | | 174/117 FF |

(Continued)

FOREIGN PATENT DOCUMENTS

| | | | |
|---|---|---|---|
| JP | 2005158337 A | | 6/2005 |
| WO | 2014021219 A1 | | 2/2014 |

*Primary Examiner* — James Harvey (57) ABSTRACT

Electrical connector includes a housing, signal contacts, and ground shields. The signal contacts are coupled to the housing and positioned for mating with mating signal contacts of a mating connector. The ground shields are coupled to the housing and at least partially surround the signal contacts to shield the signal contacts. The ground shields are plated with a ground-material composition along one or more contact segments of the ground shields that come into compression engagement with one or more other conductive members. The ground-material composition includes a tin-nickel (Sn/Ni) alloy plating layer. The signal contacts are plated with a signal-material composition that is different than the ground-material composition.

20 Claims, 5 Drawing Sheets

(56) References Cited

U.S. PATENT DOCUMENTS

| | | | |
|---|---|---|---|
| 5,235,743 A * | 8/1993 | Endo | H01R 13/03 |
| | | | 29/874 |
| 5,780,172 A | 7/1998 | Fister et al. | |
| 5,849,424 A | 12/1998 | Sugawara et al. | |
| 6,207,298 B1 | 3/2001 | Fukui | |
| 6,347,962 B1 * | 2/2002 | Kline | H01R 13/6473 |
| | | | 439/607.07 |
| 8,616,919 B2 * | 12/2013 | Stoner | H01R 13/6587 |
| | | | 439/607.07 |
| 9,859,640 B1 | 1/2018 | Horning et al. | |
| 9,966,163 B2 | 5/2018 | Sawada | |
| 10,686,282 B1 * | 6/2020 | McCarthy | H01R 13/6471 |
| 2003/0186597 A1 | 10/2003 | Suzuki et al. | |
| 2013/0217263 A1 * | 8/2013 | Pan | H01R 13/6474 |
| | | | 439/607.07 |
| 2018/0054029 A1 * | 2/2018 | Lappoehn | H01R 13/2492 |
| 2019/0036256 A1 * | 1/2019 | Martens | H01R 13/03 |
| 2019/0161866 A1 * | 5/2019 | Kubota | C25D 7/0607 |
| 2020/0106202 A1 * | 4/2020 | Consoli | H01R 13/03 |

* cited by examiner

ELECTRICAL CONNECTOR AND CONNECTOR SYSTEM HAVING PLATED GROUND SHIELDS

BACKGROUND OF THE INVENTION

The subject matter herein relates generally to electrical connectors having plated ground shields that shield signal contacts.

The electrical contacts of many known electrical connectors are often plated to improve the electrical performance and mechanical reliability of the connector. For example, the base materials of the signal and ground contacts of higher-speed connectors are often plated with one or more other materials that provide the contacts with a lower contact resistance, such as precious metals and alloys thereof. But, plating the signal and ground contacts of an electrical connector can be expensive and thereby increase the cost of manufacturing the connector, particularly when the plating includes a costly precious metal.

There is a need to reduce cost for contacts of an electrical connector without sacrificing electrical performance or durability of the electrical connector.

BRIEF DESCRIPTION OF THE INVENTION

In at least one embodiment, an electrical connector is provided that includes a housing, signal contacts, and ground shields. The signal contacts are coupled to the housing and positioned for mating with mating signal contacts of a mating connector. The ground shields are coupled to the housing and at least partially surround the signal contacts to shield the signal contacts. The ground shields are plated with a ground-material composition along one or more contact segments of the ground shields that come into compression engagement with one or more other conductive members. The ground-material composition includes a tin-nickel (Sn/Ni) alloy plating layer. The signal contacts are plated with a signal-material composition that is different than the ground-material composition.

In at least one embodiment, an electrical connector is provided that includes a housing, signal contacts, and ground shields. The signal contacts are coupled to the housing and positioned for mating with mating signal contacts of a mating connector. The signal contacts have a plating layer that includes a precious metal. The ground shields are coupled to the housing and at least partially surround the signal contacts to shield the signal contacts. The ground shields have a plating layer that includes a tin-nickel alloy along one or more contact segments of the ground shields that come into compression engagement with one or more other conductive members. The ground shields lack the precious metal included in the plating layer of the signal contacts, and the signal contacts lack the tin-nickel alloy included in the plating layer of the ground shields.

In at least one embodiment, a connector system is provided that includes a mating connector and an electrical connector. The mating connector has mating signal contacts and mating ground shields. The electrical connector includes a housing, signal contacts, and ground shields. The signal contacts are coupled to the housing and positioned for mating with the mating signal contacts of the mating connector at signal interfaces. The ground shields are coupled to the housing and at least partially surround the signal contacts to shield the signal contacts. The ground shields have mating segments positioned for mating with the mating ground shields of the mating connector at ground interfaces. The mating segments of the ground shields are plated with a ground-material composition, and the signal contacts are plated with a signal-material composition that is different than the ground-material composition. The ground-material composition includes a nickel plating layer that covers a base material of the ground shields and a tin-nickel (Sn/Ni) alloy plating layer that covers the nickel plating layer.

DETAILED DESCRIPTION OF THE INVENTION

At least some embodiments described herein include signal contacts that are configured to have a designated low-level contact resistance during operation and ground shields (or ground contacts) that are permitted to have a low-level contact resistance during operation that is greater than the designated low-level contact resistance of the signal contacts. A total resistance experienced by a communication system includes an intrinsic (or bulk) resistance and low-level contact resistance (hereinafter referred to as "LLCR") provided by interfaces between two conductors. For example, an electrical contact of a plug connector engages an electrical contact of a receptacle connector at an interface. This interface has an electrical contact resistance at the interface. The Low Level Contact Resistance or LLCR test methodology used to measure this electrical resistance employs low levels of current and voltage to ensure that any insulated films that may be present are not broken or contact asperities are not melted by the resistance measurement process. The voltage and current used to measure or determine LLCR may be, for example, 20 mV (max) open circuit at 100 mA.

Electrical contacts described herein may include a plurality of different materials. For example, an electrical contact may include a base material, such as copper or copper alloy (e.g., beryllium copper), that is plated or coated with one or more other materials. As used herein, when another material is "plated over" or "coated over" a base material, the other material may directly contact or bond to an outer surface of the base material or may directly contact or bond to an outer surface of an intermediate material. More specifically, the other material is not required to be directly adjacent to the base material and may be separated by an intermediate layer.

LLCR may be associated with a thickness of a plated layer, among other factors. At least some embodiments described herein also include ground shields having a plated layer and signal contacts having a plated layer. The plated layers of the ground shields and the plated layers of the signal contacts may have different thicknesses. For example, the thickness of the plated layers of the signal contacts may be greater than the thickness of the plated layers of the ground shields. LLCRs for ground shields having thinner plated layers may be more likely to increase after manufacturing.

LLCR corresponds to an interface between two surfaces that engage each other. For example, a signal contact engages a mating signal contact at a signal interface and a ground shield engages a mating ground shield at a ground interface. The LLCR for each interface may be measured by determining the current and/or voltage at two different points on opposite sides of the interface. The LLCR typically increases over time and with usage due to degradation processes. Degradation may occur, for example, through corrosion and wear and also through a decrease in the contact force that presses the two mated contacts against each other. These degradation processes decrease the total area along the interface at which the two mated conductors directly engage each other and effectively conduct current therebetween. Unlike signal and ground contacts in known systems, the signal contacts and ground shields set forth herein may have substantially different LLCRs. For example, after a period of operation, the LLCR of the ground shields may be ten times (10×) greater than the LLCR of the signal contacts.

An electrical contact may include a plurality of layers. For example, an electrical contact may include a base layer (or base material), an optional intermediate layer or layers plated over the base layer, and an outer layer that is plated over the intermediate layer. The intermediate layer or layers may also be referred to as an inner layer or layers.

The base layer of an electrical conductor may include copper or a copper alloy or other metals or alloys, all of which can be susceptible to corrosion. This corrosion may be eliminated by plating the base material with one or more other materials. For example, passive metals, such as tin or nickel, may be plated onto the base layer. This passive metal may form an intermediate or barrier layer. A passive film (e.g., thin oxide film) may develop along the surface of the barrier layer. This passive film may provide corrosion resistance and function as a protective barrier between the barrier layer and the surrounding environment.

In some cases, a precious metal material, such as gold, gold alloy, palladium, palladium alloy, platinum, platinum alloy, silver, and/or silver alloy, is plated onto the base material or onto an intermediate barrier layer. If this plated layer has a relatively small thickness (e.g., between 2 and 30 microinches (or 50.8 nm and 762 nm) depending upon the material), the plated layer may be referred to as a "flash layer." With or without the flash layer, a pore-blocking substance may be applied to an exterior surface of the electrical contact. The pore-blocking substance is configured to reduce corrosion along the exterior surface and may have a nominal effect upon the LLCR.

Accordingly, embodiments may include a mating array having a plurality of signal contacts and a plurality of ground shields. The signal contacts and the ground shields are positioned for mating with mating signal contacts and mating ground shields, respectively, of a mating connector. The ground shields and the signal contacts may be plated with different material compositions and/or have layers with different thicknesses. Each material composition may have one or more layers.

For example, the ground shields may be plated with a ground-material composition that is configured to cause a first low-level contact resistance (LLCR) across a ground contact interface while mated with the mating ground shields during operation. The signal contacts may be plated with a signal-material composition configured to cause a second LLCR across a signal contact interface while mated with the mating signal contacts during operation. The second LLCR may be less than the first LLCR during operation such that there is less resistance across the signal contact interfaces than across the ground contact interfaces.

As used herein, when different material compositions are "configured to cause" different LLCRs, then the different material compositions have different properties or qualities that contribute to the differences between the LLCRs. In other words, the difference between the LLCRs is not caused exclusively by the contacts of the other connector. The differences between the LLCRs may be substantially caused by the material compositions of the recited conductors. For example, the materials that comprise the material composition and/or the thickness of the plating layer or layers of the material composition may be selected so that the differences in LLCR may occur. In some embodiments, the material composition for the ground shields may be more cost-effective than the material composition for the signal contacts. Moreover, it should be understood that the phrase "configured to cause" does not mean mere capability in a hypothetical or theoretical sense but means a likelihood that the material composition will cause the LLCR if the electrical connectors are used as expected.

Because LLCRs may increase over time, the LLCR may be determined when the contacts have a predetermined condition. For example, an accelerated-aging protocol may be applied to determine the LLCR that occurs at an end-of-life (EOL). The LLCR at EOL may represent an approximate maximum of the LLCR.

For example, the ground-material composition of a ground shield may be configured to cause a first LLCR between 100 milliohms and 25 ohms while mated with a mating ground shield during operation after applying an accelerated-aging protocol. In at least one embodiment, the first LLCR at the ground interface between the ground-material composition of the ground shield and the mating ground shield remains within a designated resistance range between 0 and 10 ohms throughout the operational lifetime of the ground shield. The signal-material composition may be configured to cause a second LLCR that is at most 10 milliohms while mated with a mating signal contact during operation after applying the accelerated-aging protocol. In some embodiments, the first LLCR may be at least 10× greater than the second LLCR after applying the accelerated-aging protocol. In certain embodiments, the first LLCR may be at least 25× greater than the second LLCR after applying the accelerated-aging protocol. In particular embodiments, the first LLCR may be at least 50× greater than the second LLCR after applying the accelerated-aging protocol.

The accelerated-aging protocol may be provided by an industry standards test method. For example, one standard that may be used is Telcordia GR-1217-Core "Generic Requirements for Separable Electrical Connectors Used In Telecommunications Hardware." Such accelerated-aging protocols may be designed to address one or more degradation mechanisms that may be present for an electrical connector. The accelerated-aging protocols are typically comprised of tests or sequences of tests designed to address specific degradation mechanisms. When considering the outer-most metallic layer, it is appropriate to consider the degradation mechanisms specific to the outer-most metallic layer. The tests or test sequences addressing the outer-most metallic layers typically focus on wear and corrosion mechanisms.

Accelerated-aging protocols may include, for example, at least one of (a) repeatedly mating and un-mating the electrical contacts (see, e.g., EIA-364-TP09), thereby causing wear along the interfaces; (b) applying mechanical shock conditions (see, e.g., EIA-364-TP27); (c) applying random vibration conditions (see, e.g., EIA-364-TP28); (d) applying thermal shock cycles in which the temperature is significantly changed (e.g., about 150 degrees Celsius) (see, e.g., EIA-364-TP32); (e) applying cycles in which the humidity of the environment is repeatedly changed (see, e.g., EIA-364-TP31); (f) exposing the electrical connectors or contacts to dust (see, e.g., EIA-364-TP91); (g) exposing the electrical contacts to a sustained high temperature (see, e.g., EIA-364-TP17); and (h) applying mixed flowing gas (see, e.g., EIA-364-TP17, EIA-364-TP09, EIA-364-TP65 Class IIA).

In some embodiments, the signal contacts immediately after manufacturing and prior to usage or storage, may have an LLCR that is at most 10 milliohms or, more particularly, at most 5 milliohms. In some embodiments, the signal contacts may be at most 10 milliohms at EOL. The ground shields may have at most 10 ohms at EOL.

Although it is desirable that a plated layer have a uniform thickness along the respective electrical contact, this may be difficult to achieve. Accordingly, a thickness of the layer means an average thickness along the region where the two contacts engage each other. The average thickness may be determined using, for example, a scanning electron microscope (SEM).

Various testing standards may be used to measure LLCR. For example, one standard that may be used to measure LLCR includes Telcordia GR-1217-Core "Generic Requirements for Separable Electrical Connectors Used In Telecommunications Hardware." Unless stated otherwise in the claims, the LLCR at EOL is measured or determined in a manner consistent with Telcordia GR-1217-Core. Other standards may include EIA 364-23, MIL-STD-202, MIL-J-641, MIL-E-2036, MIL-STD-3885, or MIL-H-83511.

In particular embodiments, the electrical contacts provide signal pathways for transmitting data signals. Embodiments may be particularly suitable for communication systems, such as network systems, servers, data centers, and the like, in which the data rates may be greater than ten (10) gigabits/second (Gbps) or greater than five (5) gigahertz (GHz). One or more embodiments may be configured to transmit data at a rate of at least 20 Gbps, at least 40 Gbps, at least 56 Gbps, or more. One or more embodiments may be configured to transmit data at a frequency of at least 10 GHz, at least 20 GHz, at least 28 GHz, or more. As used herein with respect to data transfer, the term "configured to" does not mean mere capability in a hypothetical or theoretical sense, but means that the embodiment is designed to transmit data at the designated rate or frequency for an extended period of time (e.g., expected time periods for commercial use) and at a signal quality that is sufficient for its intended commercial use. It is contemplated, however, that other embodiments may be configured to operate at data rates that are less than 10 Gbps or operate at frequencies that are less than 5 GHz.

Various embodiments may be configured for certain applications. One or more embodiments may be configured for backplane or midplane communication systems. For example, one or more of the electrical connectors described herein may be similar to electrical connectors of the STRADA Whisper or Z-PACK TinMan product lines developed by TE Connectivity. The electrical connectors may include high-density arrays of electrical contacts. A high-density array may have, for example, at least 12 signal contacts per 100 mm2 along the mating side or the mounting side of the electrical connector. In more particular embodiments, the high-density array may have at least 20 signal contacts per 100 mm2. Non-limiting examples of some applications that may use embodiments set forth herein include host bus adapters (HBAs), redundant arrays of inexpensive disks (RAIDs), workstations, servers, storage racks, high performance computers, or switches. Embodiments may also include electrical connectors that are small-form factor connectors. For example, the electrical connectors may be configured to be compliant with certain standards, such as, but not limited to, the small-form factor pluggable (SFP) standard, enhanced SFP (SFP+) standard, quad SFP (QSFP) standard, C form-factor pluggable (CFP) standard, and 10 Gigabit SFP standard, which is often referred to as the XFP standard.

In order to distinguish similar elements in the detailed description and claims, various labels may be used. For example, an electrical connector may be referred to as a header connector, a receptacle connector, or a mating connector. Electrical contacts may be referred to as header contacts, receptacle contacts, mating contacts, signal contacts, or ground shields. Signal contacts, as used herein, refer generally to conductors that convey signals (e.g., control signals or data) via electrical current. Ground shields, as used herein, refer generally to conductors that convey electrical current for grounding and/or return signal paths. The term ground shields is not intended to denote specific shapes or sizes, and ground shields may also be referred to as ground conductors and ground contacts. When similar elements are labeled differently, the different labels do not necessarily require structural differences.

Figure 1:
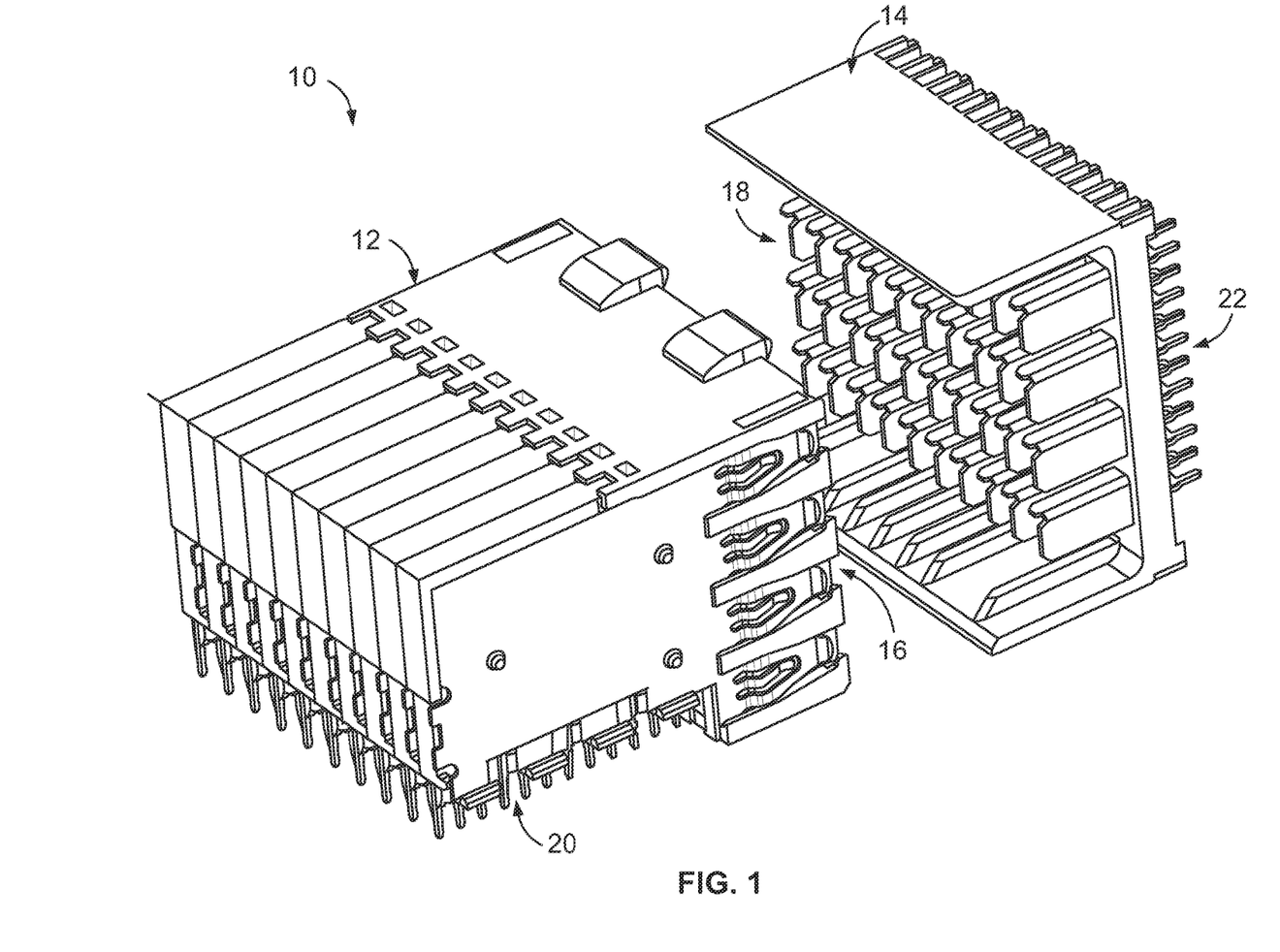
FIG. 1 is a perspective view of an embodiment of a connector system.

FIG. 1 is a perspective view of an embodiment of a connector system 10. The connector system 10 includes a first electrical connector 12 and a second electrical connector 14 that are configured to mate together to establish an electrical connection between two circuit boards (not shown). The first electrical connector 12 and the second electrical connector 14 include respective mating interfaces 16 and 18 at which the connectors 12 and 14 are configured to be mated together. Reference herein to an "electrical connector" may refer to either of the first electrical connector 12 or the second electrical connector 14. In the illustrated embodiment, the first electrical connector 12 may be a receptacle connector, and the second electrical connector 14 may be a header connector. The first electrical connector 12 is also referred to herein as receptacle connector 12, and the second electrical connector 14 is also referred to herein as header connector 14.

The receptacle connector 12 is configured to be mounted to one of the circuit boards along a mounting interface 20 of the receptacle connector 12. Similarly, the header connector 14 is configured to be mounted to the other circuit board along a mounting interface 22 of the header connector 14. In the illustrated embodiment, the mounting interface 20 of the receptacle connector 12 is oriented approximately perpendicular to the mating interface 16 of the receptacle connector 12, and the mounting interface 22 of the header connector 14 is oriented approximately parallel to the mating interface 18 of the header connector 14. Accordingly, when the receptacle connector 12 is mated with the header connector 14, the circuit boards are oriented approximately perpendicular to each other. However, other orientations are possible in other embodiments.

Figure 2:
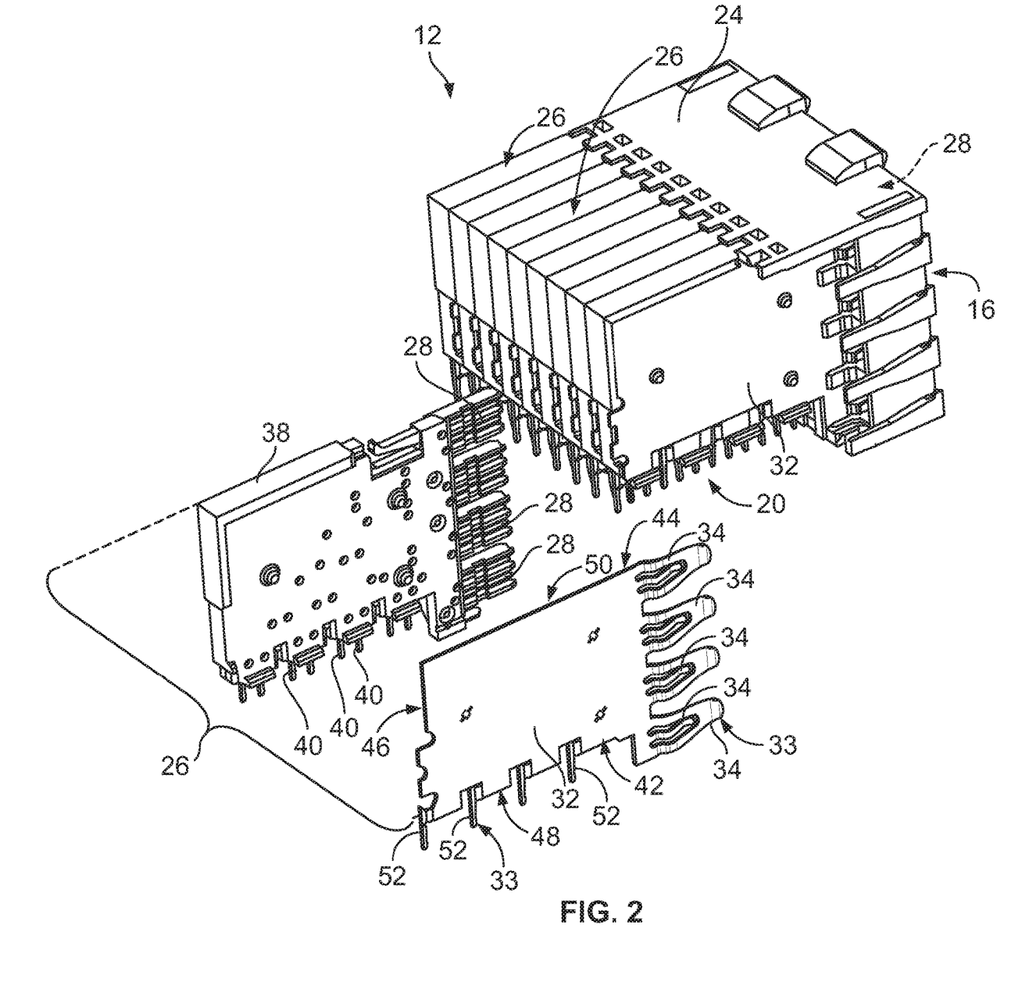
FIG. 2 is a partially exploded perspective view of an embodiment of a receptacle connector of the connector system.

FIG. 2 is a partially exploded perspective view of an embodiment of the receptacle connector 12. The receptacle connector 12 includes a housing 24 that holds a plurality of contact modules 26. The contact modules 26 are held in a stacked configuration generally parallel to one another. The contact modules 26 hold a plurality of signal contacts 28 that extend along the mating interface 16 for mating with corresponding mating signal contacts 30 (shown in FIG. 3) of the header connector 14 (FIG. 1). Optionally, the signal contacts 28 are arranged in pairs carrying differential signals, as is shown in the illustrated embodiment. In the illustrated embodiment, the contact modules 26 are oriented generally along vertical planes. But, other orientations are possible in other embodiments. For example, in some embodiments, the contact modules 26 are oriented generally along horizontal planes.

The housing 24 is manufactured from a dielectric material, such as, but not limited to, a plastic material and/or the like. The housing 24 includes a plurality of signal contact openings (not shown) and a plurality of ground contact openings (not shown) extending along the mating interface 16. The contact modules 26 are mounted to the housing 24 such that the signal contacts 28 are received in corresponding signal contact openings. When received within the corresponding signal contact openings, the signal contacts 28 define a portion of the mating interface 16 of the receptacle connector 12. Optionally, a single signal contact 28 is received in each signal contact opening. The signal contact openings also receive corresponding mating signal contacts of the header connector 14 when the receptacle connector 12 is mated with the header connector 14.

The signal contact openings, and thus the signal contacts 28, may be arranged in any pattern. In the illustrated embodiment, the signal contact openings are arranged in an array of rows and columns. The columns are oriented generally vertically and the rows are oriented generally horizontally; however, other orientations are possible in other embodiments. In the illustrated embodiment, the signal contacts 28 within each differential pair are arranged in a same column, and thus the receptacle connector 12 defines a pair-in-column receptacle connector. In other embodiments, the signal contacts 28 within each differential pair are arranged in the same row such that the receptacle connector 12 defines a pair-in-row receptacle connector.

Each contact module 26 includes a dielectric carrier 38 that holds an array of signal conductors. The carrier 38 may be overmolded over the array of signal conductors, though additionally or alternatively other manufacturing processes may be utilized to form the carrier 38. Optionally, the signal conductors are stamped and formed as an integral leadframe prior to overmolding of the carrier 38. Portions of the leadframe that connect the conductors are removed after the overmolding to provide individual conductors in the array held by the carrier 38. In addition or alternatively, other manufacturing processes are used to form the signal conductors.

The signal conductors include the signal contacts 28, a plurality of mounting contacts 40, and intermediate segments or leads (not shown) that connect the signal contacts 28 to the corresponding mounting contacts 40. The signal contacts 28, the leads, and the mounting contacts 40 define signal paths through the contact module 26. In the illustrated embodiment, the signal contacts 28 include receptacle-type mating ends having a receptacle that is configured to receive a pin-type contact 30 of the header connector 14. Other types, structures, and/or the like of signal contacts 28 may be provided in other embodiments.

The mounting contacts 40 are configured to be mounted to the corresponding circuit board in electrical contact therewith to electrically connect the signal contacts 28 to the circuit board. When the contact module 26 is mounted to the housing 24 of the receptacle connector 12, the mounting contacts 40 extend along (and define a portion of) the mounting interface 20 of the receptacle connector 12 for mounting the receptacle connector 12 to the circuit board. In the illustrated embodiment, the mounting contacts 40 are compliant eye-of-the needle (EON) pins, but any other type, structure, and/or the like of contact may additionally or alternatively be used to mount the receptacle connector 12 to the circuit board, such as, but not limited to, a different type of compliant pin, a solder tail, a surface mount structure, and/or the like.

The receptacle connector 12 includes ground shields 32 within the contact modules 26. The ground shields 32 provide impedance control along the signal path and/or electrical shielding for the signal contacts 28 from electromagnetic interference (EMI) and/or radio frequency interference (RFI). The ground shields 32 include one or more contact segments 33 that come into compression engagement with one or more other conductive members. For example, each contact segment 33 abuts against another conductive member and is held in sustained engagement with the conductive member via pressure, without being permanently bonded (e.g., soldered, welded, etc.) to the conductive member or secured to the conductive member via a fastener or the like. Some non-limiting examples of compression engagements include press-fit mating, mating via deflectable spring beams, interference fits, and the like.

Each ground shield 32 includes a body 42 that extends a length from a front end 44 to a rear end 46. The body 42 also extends from a mounting end 48 to an opposite end 50. The body 42 of the ground shield 32 is electrically conductive and is configured to provide impedance control and/or shield the signal contacts 28 from electromagnetic interference (EMI) and/or radio frequency interference (RFI). Specifically, the body 42 extends over and surrounds at least a portion of the corresponding signal conductors of the contact module 26 when the ground shield 32 is mounted to the corresponding dielectric carrier 38.

The ground shields 32 include mating segments (or mating contact segments) 34 that represent one of the contact segments 33. The mating segments 34 are configured to mate with corresponding mating ground shields 36 (shown in FIG. 3) of the header connector 14 at a separable mating interface. In the illustrated embodiment, the mating segments 34 are deflectable spring beams. The contact modules 26 are mounted to the housing 24 such that the mating segments 34 of the ground shields 32 are received in corresponding ground contact openings. Optionally, a single mating segment 34 is received in each ground contact opening. The ground contact openings also receive the corresponding mating ground shields 36 of the header connector 14 therein when the receptacle connector 12 is mated with the header connector 14.

The mating segments 34 extend along the front end 44 of the body 42 of the ground shield 32. As should be apparent from FIG. 2 and the description herein, the mating segments 34 are electrically connected together by the body 42 of the ground shield 32 in the illustrated embodiment. But, alternatively the mating segments 34 are not electrically connected together. When the ground shield 32 is mounted to the corresponding carrier 38 of the corresponding contact module 26, the mating segments 34 define a portion of the mating interface 16 of the receptacle connector 12. In the illustrated embodiment, the mating segments 34 include spring beams. Other types, structures, and/or the like of the mating segments 34 may be provided in other embodiments.

The ground shields 32 may include mounting segments (or mounting contact segments) 52 that represent one contact segment 33 of the ground shields 32. The mounting segments 52 extend along the mounting end 48 and are configured to be mounted to the corresponding circuit board in electrical contact therewith to electrically connect the ground shield 32 to a ground plane (not shown) of the circuit board. When the contact module 26 that includes the ground shield 32 is mounted to the housing 24 of the receptacle connector 12, the mounting segments 52 extend along (and define a portion of) the mounting interface 20 of the receptacle connector 12 for mounting the receptacle connector 12 to the circuit board. In the illustrated embodiment, the mounting segments 52 are compliant eye-of-the needle (EON) pins that are press-fit inserted into conductive holes (e.g., plated vias or thru-holes) of the circuit board. But, additionally or alternatively, any other type, structure, and/or the like of contact may be used to mount the receptacle connector 12 to the circuit board, such as, but not limited to, a different type of compliant pin, a solder tail, a surface mount structure, and/or the like.

Although not shown in FIG. 2, the ground shields 32 may also include coupling segments (or coupling contact segments) that represent one contact segment 33 of the ground shields 32. The coupling segments of the ground shields 32 engage adjacent ground shields 32 of the receptacle connector 12. For example, the coupling segments may include tabs, bridges, skewers, and the like that extend from the body 42 of the ground shield 32 through the contact module 26 and engage an adjacent ground shield 32. The adjacent ground shield 32 may be mounted onto the same contact module 26 along the opposite side of the contact module 26 or may be mounted onto a different contact module 26. The coupling segment engages the adjacent ground shield 32 via compression engagement, such as due to a biasing spring force that sustains contact between the coupling segment and the adjacent ground shield 32. The coupling segment of one ground shield 32 may engage either the body 42 of the adjacent ground shield 32 or a coupling segment of the adjacent ground shield 32. The coupling segment electrically connects at least two adjacent ground shields 32 together, which electrically commons the ground shields 32. Optionally, the coupling segment may extend across multiple contact modules 26 of the connector 12, engaging and electrically connecting more than two ground shields 32.

Figure 3:
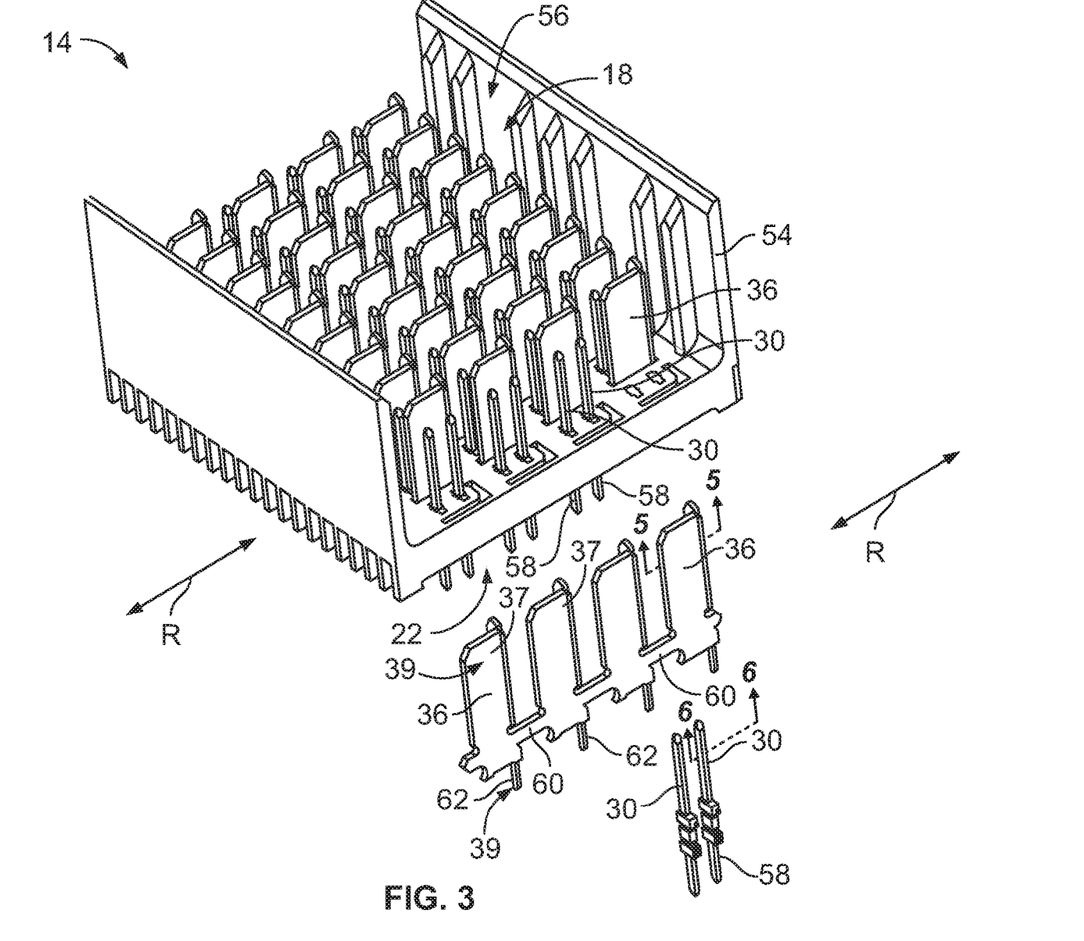
FIG. 3 is a partially exploded perspective view of an embodiment of a header connector of the connector system.

FIG. 3 is a partially exploded perspective view of an embodiment of the header connector 14. The header connector 14 includes a housing 54 that holds the signal contacts 30 and the ground shields 36 of the header connector 14. The housing 54 is manufactured from a dielectric material, such as, but not limited to, a plastic material and/or the like. In the illustrated embodiment, the housing 54 of the header connector 14 includes a receptacle 56 that receives a portion of the housing 24 (shown in FIG. 2) of the receptacle connector 12 (FIG. 2) therein when the connectors 12 and 14 are mated together.

As shown in FIG. 3, the signal contacts 30 extend along the mating interface 18 of the header connector 14 for mating with the corresponding mating signal contacts 28 (shown in FIG. 2) of the receptacle connector 12. Optionally, the signal contacts 30 are arranged in pairs carrying differential signals, as is shown in the illustrated embodiment. The signal contacts 30 may be arranged in any pattern. In the illustrated embodiment, the signal contacts 30 are arranged in an array of rows and columns; however, other orientations are possible in other embodiments. In the illustrated embodiment, the signal contacts 30 include pins; however, other types, structures, and/or the like of signal contacts 30 may be provided in other embodiments.

The signal contacts 30 of the header connector 14 include signal mounting ends 58 that extend along (and define a portion of) the mounting interface 22 of the header connector 14 for mounting the header connector 14 to the corresponding circuit board. Specifically, the signal mounting ends 58 are configured to be mounted to the corresponding circuit board in electrical contact therewith to electrically connect the signal contacts 30 to the circuit board. In the illustrated embodiment, the signal mounting ends 58 are compliant eye-of-the needle (EON) pins, but any other type, structure, and/or the like of contact may additionally or alternatively be used to mount the header connector 14 to the circuit board, such as, but not limited to, a different type of compliant pin, a solder tail, a surface mount structure, and/or the like.

The ground shields 36 of the header connector 14 provide impedance control and/or electrical shielding for the signal contacts 30 from EMI and/or RFI. Specifically, the ground shields 36 surround at least a portion of corresponding signal contacts 30 of the header connector 14. The ground shields 36 have one or more contact segments 39 that come into compression engagement with one or more other conductive members. For example, the ground shields 36 may include mating segments 37 (e.g., mating contact segments) that represent one contact segment 39. The mating segments 37 extend along (and define a portion of) the mating interface 18 of the header connector 14 for mating with the corresponding ground shields 32 (shown in FIG. 2) of the receptacle connector 12. In the illustrated embodiment, the ground shields 36 create a commoned (i.e., electrically connected) ground structure between the connectors 12 and 14. In the illustrated embodiment, the ground shields 36 are electrically connected together with at least some adjacent ground shields 36 by electrical bridges 60. In the illustrated embodiment, the ground shields 36 within the same row R are electrically connected together. But, alternatively the ground shields 36 are not electrically connected together. The ground shields 36 include blade structures in the illustrated embodiment; however, other types, structures, and/or the like of the ground shields 36 may be provided in other embodiments.

The ground shields 36 of the header connector 14 may include mounting segments 62 (e.g., mounting contact segments) that represent another contact segment 39. The mounting segments 62 extend along (and define a portion of) the mounting interface 22 of the header connector 14 for mounting the header connector 14 to the corresponding circuit board. Specifically, the mounting segments 62 are configured to be mounted to the corresponding circuit board in electrical contact therewith to electrically connect the ground shields 36 to a ground plane (not shown) of the circuit board. In the illustrated embodiment, the ground mounting segments 62 are compliant eye-of-the needle (EON) pins, but any other type, structure, and/or the like of contact may additionally or alternatively be used to mount the header connector 14 to the circuit board, such as, but not limited to, a different type of compliant pin, a solder tail, a surface mount structure, and/or the like.

Although not shown in FIG. 3, at least some of the ground shields 36 may include coupling segments that engage ground shields 36 in adjacent rows R via compression engagement to electrically common the ground shields 36 of multiple rows R.

Figure 4:
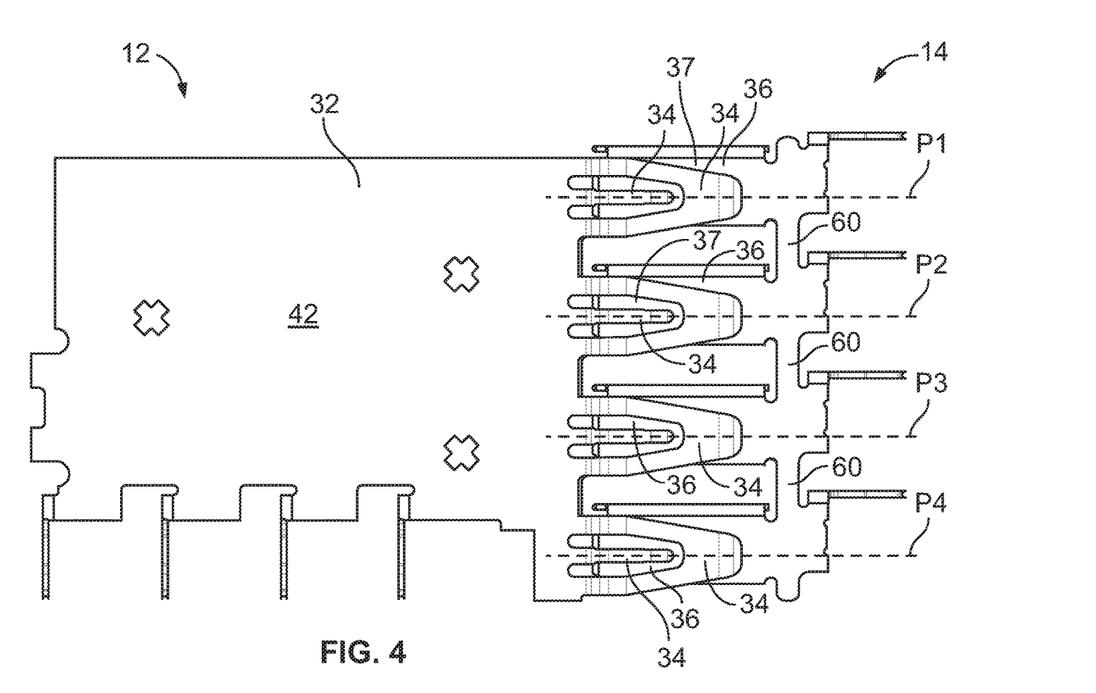
FIG. 4 is an elevational view of a portion of the receptacle connector and a portion of the header connector illustrating the connectors mated together.

FIG. 4 is an elevational view of a portion of the receptacle connector 12 and a portion of the header connector 14 illustrating the connectors 12 and 14 mated together. As shown in FIG. 4, the mating segments 34 of the visible ground shield 32 of the receptacle connector 12 are mated with the corresponding mating segments 37 of the ground shields 36 of the header connector 14 at corresponding ground interfaces. The mating segments 34 of the ground shield 32 are integrally connected together by the body 42 of the ground shield 32. Moreover, the ground shields 36 of the header connector 14 are electrically connected together by the electrical bridges 60. Accordingly, the mating segments 34 of the ground shield 32 and the mating segments 37 of the ground shields 36 shown in FIG. 4 define four parallel resistance paths $P_1$-$P_4$ across the ground interfaces when mated.

Referring again to FIGS. 2 and 3, the signal contacts 28 of the receptacle connector 12 and the signal contacts 30 of the header connector 14 are plated with one or more materials to improve the electrical performance and/or mechanical reliability of the signal contacts 28 and 30. For example, the signal contacts 28 and/or 30 may be plated with one or more materials that provide the signal contacts 28 and/or 30 with a lower contact resistance and/or with one or more materials that increase the durability of the signal contacts 28 and/or 30 to thereby reduce the wear generated from repeated mating and de-mating of the connectors 12 and 14. Providing the signal contacts 28 and/or 30 with a lower contact resistance may include, but is not limited to, plating the signal contacts 28 and 30 with a material with a relatively high electrical conductivity and relatively low electrical resistance, with a material that resists, inhibits, and/or reduces corrosion, and/or the like. Increasing the durability of the signal contacts 28 and/or 30 may include, but is not limited to, plating the signal contacts 28 and/or 30 with a material with a relatively high hardness, with a material that resists, inhibits, and/or reduces corrosion, and/or the like.

The signal contacts 28 and 30 may be fabricated from any base material, such as, but not limited to, copper, a copper alloy, and/or the like. The signal contacts 28 and 30 may include any number of layers of plating on the base material. Each layer of plating may have any thickness, which may be selected to provide the particular signal contact 28 or 30 with one or more electrical and/or mechanical properties (such as, but not limited to, durability, conductance, resistance, impedance, resilience, and/or the like). Examples of materials that may be plated on the signal contacts 28 and 30 include materials that inhibits, resists, and/or reduces corrosion, materials with a relatively high electrical conductivity and relatively low electrical resistance, and/or materials with a relatively high hardness. These materials may include precious metals, precious metal alloys, nickel (Ni), nickel alloys, and/or the like. For example, the precious metals may include gold (Au), silver (Ag), palladium (Pd), platinum (Pt), and alloys thereof.

The ground shields 32 of the receptacle connector 12 and the ground shields 36 of the header connector 14 may be plated with one or more materials to improve the electrical performance and/or mechanical reliability of the ground shields 32 and the ground shields 36. In some embodiments, the ground shields 32 and/or the ground shields 36 are not plated with any materials (i.e., no plating is deposited on the base material of the ground shields 32 and/or the ground shields 36), as will be briefly discussed below.

The ground shields 32 and the ground shields 36 have different plating as compared to the signal contacts 28 and 30. Specifically, the plating of the signal contacts 28 and 30 may include at least one material that is different from any of the plating materials of the ground shields 32 and the ground shields 36. In other words, in some embodiments, the plating of the ground shields 32 and the ground shields 36 lacks one or more of the materials contained within the plating of the signal contacts 28 and 30. Conversely, the plating of the signal contacts 28 and 30 may lack one or more of the materials contained within the plating of the ground shields 32 and 36. In addition or alternative to lacking one or more materials, the plating of the ground shields 32 and 36 may differ from the plating of the signal contacts 28 and 30 by including a different amount of one or more of the same materials. For example, the plating of the ground shields 32 and 36 may include a layer of material that is thinner than a corresponding layer of the same material in the signal contact plating. The ground shields 32 and the ground shields 36 may have any number of layers of plating on the base material thereof, which may be greater than, equal to, or less than the number of layers of the plating of the signal contacts 28 and 30.

Figure 5:
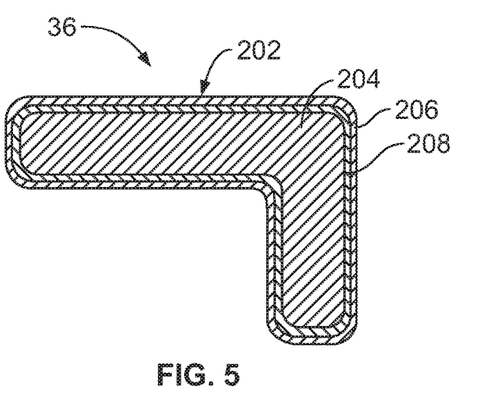
FIG. 5 is a cross-sectional view of a ground shield of the header connector according to an embodiment.

FIG. 5 is a cross-sectional view of one of the ground shields 36 of the header connector 14 according to an embodiment. The cross-section is taken along the line 5-5 in FIG. 3. The line 5-5 extends through the ground shield 36 at the mating segment 37 (shown in FIG. 3) thereof. The ground shield 36 is plated with a ground-material composition 202 along the mating segment 37. In the illustrated embodiment, the ground shield 36 includes a base material 204 and the ground-material composition 202 is plated on the base material 204. The ground-material composition 202 may include multiple layers, such as an outer plating layer 206 and an intermediate plating layer 208 that is disposed between the base material 204 and the outer plating layer 206. For example, an inner surface of the intermediate plating layer 208 may engage the base material 204 and an outer surface of the intermediate plating layer 208 may engage the outer plating layer 206. The outer plating layer 206 may represent an outermost metal layer of the ground shield 36 along the mating segment 37. For example, the ground shield 36 optionally may have a non-metal substance, such as a pore-blocking lubricant, along the outer plating layer 206. The pore-blocking lubricant may prevent fretting corrosion due to vibrations during operation.

In the illustrated embodiment, the base material 204 of the ground shield 36 may be or include copper, a copper alloy (e.g., beryllium copper), stainless steel, a silver-nickel (Ag/Ni) alloy, or the like. The intermediate plating layer 208 of the ground-material composition 202 may be or include nickel or a nickel alloy, such as palladium-nickel. In at least one embodiment, the intermediate plating layer 208 is nickel, and may be referred to herein as nickel plating layer 208. The nickel plating layer 208 may serve as a protector of the base material 204, such as by blocking oxidation of the base material 204. The nickel plating layer 208 may increase the durability of the ground shield 36.

The outer plating layer 206 of the ground-material composition 202 is a tin-nickel (Sn/Ni) alloy, and may be referred to herein as tin-nickel alloy plating layer 206. The tin-nickel alloy plating layer 206 may contain at least half tin by weight (or mass). For example, the tin-nickel alloy plating layer 206 may include between about 55 wt % and 75 wt % of tin and between about 25 wt % and about 45 wt % of nickel. For example, the tin content and the nickel content may represent the balance of the plating layer 206 in addition to any unavoidable impurities. It is noted that the nickel content of the nickel plating layer 208 is separate and discrete from the nickel content in the tin-nickel alloy plating layer 206. As used herein, reference to a value and/or range that is preceded by the term "about" is inclusive of the stated value and numerical values greater and less than the stated value within a designated error or threshold range (e.g., within 0.5% or 1% of the stated value). In one specific embodiment, the tin-nickel alloy plating layer 206 contains about 65 wt % of tin and about 35 wt % of nickel. The tin-nickel alloy is a stable alloy that is relatively simple to apply. For example, the LLCR of the tin-nickel alloy plating layer 206 may remain within a designated resistance range throughout the operational lifetime of the ground shield 36. The designated resistance range may be between 0 and 10 ohms, such that the resistance of the playing layer 206 does not exceed 10 ohms even at the end of life (EOL) of the ground shield 36. The tin-nickel alloy plating layer 206 may be more stable than some known plating materials that have LLCR values that significantly increase over the life to values in excess of 10 ohms.

The plating layers 206, 208 of the ground-material composition 202 may have any respective thickness, which may be selected to provide the ground shield 36 with one or more electrical and/or mechanical properties (such as, but not limited to, durability, conductance, resistance, impedance, resilience, and/or the like). For example, in an embodiment, the thickness of the tin-nickel alloy plating layer 206 may be between about 5 microinches and about 100 microinches (or about 127 nm to about 2540 nm).

Although the ground-material composition 202 in the illustrated embodiment has two plating layers 206, 208, the ground-material composition 202 may have only one layer or at least three plating layers in alternative embodiments. For example, the tin-nickel alloy plating layer 206 may be the only layer in one alternative embodiment such that the plating layer 206 is deposited directly on the base material 204, or the ground-material composition 202 may include a second intermediate plating layer between the outer tin-nickel alloy plating layer 206 and the base material 204.

Figure 6:
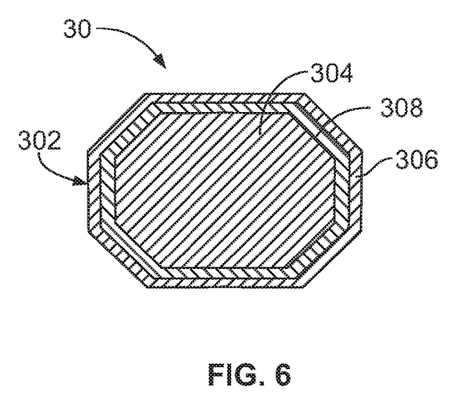
FIG. 6 is a cross-sectional view of a signal contact of the header connector according to an embodiment.

FIG. 6 is a cross-sectional view of one of the signal contacts 30 of the header connector 14 according to an embodiment. The cross-section is taken along the line 6-6 in FIG. 3. The signal contact 30 is plated with a signal-material composition 302. In the illustrated embodiment, the signal contact 30 includes a base material 304 and the signal-material composition 302 is plated on the base material 304. The signal-material composition 302 may include multiple layers, such as an outer plating layer 306 and an intermediate plating layer 308 that is disposed between the base material 304 and the outer plating layer 306. The intermediate plating layer 308 may be plated directly on the base material 304, and the outer plating layer 306 may be plated directly on the intermediate plating layer 308.

The base material 304 may be, for example, a copper or copper alloy (e.g., beryllium copper). The intermediate plating layer 308 may include nickel and/or tin and may function as a diffusion barrier between the base material 304 and the outer plating layer 306. The outer plating layer 306 may include a precious metal or a precious metal alloy, such as palladium-nickel, gold, gold alloy, silver, silver alloy, or the like. The material of the outer plating layer 306 may be selected to provide a low contact resistance. For example, the material of the outer plating layer 306 may reduce or limit rust, corrosion, oxidation, another chemical process, and/or the like. The outer plating layer 306 may have a thickness that exceeds, for example, 30 microinches (i.e., 762 nm). The signal-material composition 302 that is plated on the base material 304 may include only one plating layer or at least three plating layers in alternative embodiments.

In the illustrated embodiments shown in FIGS. 5 and 6, the plating of the ground shield 36 (e.g., the ground-material composition 202) is different from the plating of the signal contact 30 (e.g., the signal-material composition 302). For example, the ground-material composition 202 in the illustrated embodiment lacks one or more of the materials of the signal-material composition 302 that are selected to provide the signal contact 30 with a low contact resistance. More specifically, the ground-material composition 202 lacks precious metal, such as such as gold, silver, palladium, and platinum, while the signal-material composition 302 includes a precious metal within the outer plating layer 306. Because precious metals are known to provide a low contact resistance, the signal contacts 30 that have precious metal in the outer plating layer 306 may have a lower contact resistance (e.g., LLCR) than the ground shield 36 that lack precious metals. The ground-material composition 202 along the mating segment 37 of the ground shields 36 may be configured to cause a first LLCR while mated with ground shields 32 of the receptacle connector 12 during operation, and the signal-material composition 302 of the signal contacts 30 may be configured to cause a second LLCR, which is less than the first LLCR, while mated with the signal contacts 28 of the receptacle connector 12 during operation. For example, the signal contact 30 may have a contact resistance (e.g., a LLCR) of equal to or less than 10 milliohms, while the ground shield 36 may have a contact resistance (e.g., a LLCR) from approximately 20 milliohms to approximately 10 ohms.

Eliminating or reducing plating materials that are selected to provide a low contact resistance may reduce the cost of plating the ground shields 36, which may thereby reduce the cost of manufacturing the header connector 14. For example, precious metal plating materials that provide low contact resistance are relatively expensive (e.g., compared to more common metals such as copper and nickel). Eliminating precious metals from the plating of the ground shields 36 may significantly reduce the cost of plating the ground shields 36.

The higher contact resistance of the ground shields 36 relative to the signal contacts 30 may not adversely affect the electrical performance of the header connector 14 at relatively high frequencies (e.g., at frequencies of at least 10 Gigabits). At relatively high frequencies, the magnitude of electrical resistance depends on, for example, interface dimensions, plating materials, dielectric materials, surface roughness, skin effect, and/or the like. It should be understood that the impedance of an electrical interface at relatively high frequency is determined not only by direct current (DC) contact resistance, but also by capacitive and inductive coupling mechanisms. For example, because of the parallel resistance paths $P_1$-$P_4$ (described above with reference to FIG. 4) defined by the ground shields 36, the ground contact resistance will be reduced according to the parallel resistor equation. Specifically, the parallel ground resistance circuit of the parallel resistance paths $P_1$-$P_4$ will lower the effect of any single relatively high resistance value at individual ground contact interfaces.

Therefore, the ground shields 36 having a greater contact resistance than the signal contacts 30 may not lower the transmission speeds or transmission quality of the header connector 14. The contact resistance of the ground shields 36 may not inhibit the ability of the connector 14 to reliably transmit signals at a rate of at least 10 Gigabits. It is recognized that although the contact resistance of the ground-material composition 202 of the ground shields 36 is greater than the contact resistance of the signal-material composition 302 of the signal contacts 30, the contact resistance of the ground-material composition 202 is relatively stable and remains within a designated acceptable resistance range throughout the operational lifetime of the ground shield 36. The designated acceptable resistance range may have an upper limit of 5 ohms, 10 ohms, or 15 ohms. In one particular embodiment, the upper limit of the acceptable resistance range is 10 ohms.

The ground-material composition 202 of the ground shield 36 shown in FIG. 5 may also include one or more materials that are not present in the signal-material composition 302 of the signal contact 30 shown in FIG. 6. For example, the signal-material composition 302 may lack a tin-nickel alloy plating layer, unlike the ground-material composition 202 that has a tin-nickel alloy as the outer plating layer 206. For example, the signal contact 30 may lack a tin-nickel alloy material.

Figure 7:
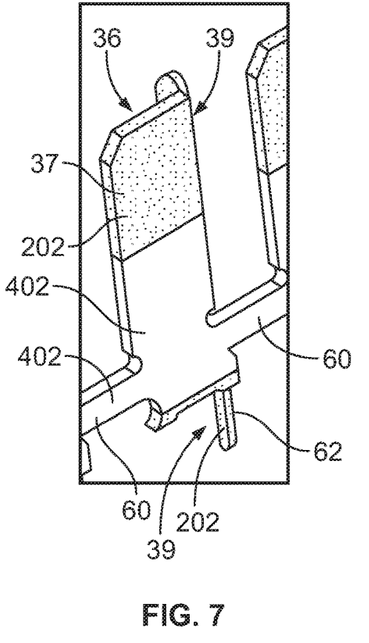
FIG. 7 is an enlarged perspective view of one of the ground shields of the header connector according to an embodiment.

FIG. 7 is an enlarged perspective view of one of the ground shields 36 of the header connector 14 according to an embodiment. The ground shield 36 is plated with the ground-material composition 202 (described with reference to FIG. 5) along at least one of the contact segments 39 of the ground shield 36. As described above, the contact segments 39 are areas of the ground shield 36 that come into compression engagement with one or more other conductive members, such as mating ground shields 32, printed circuit boards, or adjacent ground shields 36. The contact segments 39 may wipe against the corresponding conductive member during mating, mounting, or assembly. The contact segments 39 may be held in sustained engagement with the conductive member via pressure without the use of bonding (e.g., soldering, welding, or the like) or fasteners.

In the illustrated embodiment, the ground shield 36 has two contact segments 39 that come into compression engagement, including the mating segment 37 and the mounting segment 62. Both the mating segment 37 and the mounting segment 62 are plated with the ground-material composition 202. For example, both the base material 204 (shown in FIG. 5) of the ground shield 36 is plated with a nickel plating layer 208 (FIG. 5) and then a tin-nickel alloy plating layer 206 (FIG. 5) is plated over the nickel plating layer 208. The areas of the ground shield 36 that have the ground-material composition 202 are dotted in FIG. 7 for illustrative purposes. The tin-nickel alloy plating layer 206 may provide durability and a stable contact resistance along the contact segments 39. For example, as described above, the contact resistances at the contact segments 39 may remain within a tolerable resistance range throughout an operational lifetime of the ground shields 36.

In the illustrated embodiment, the ground-material composition 202 is not plated over the entire ground shield 36. For example, the ground shield 36 lacks the ground-material composition 202 along portions 402 of the ground shield 36 outside of the contact segments 39. The portions 402 of the ground shield 36 outside of the contact segments 39 in FIG. 7 include a middle segment of the ground shield 36 between the mating segment 37 and the mounting segment 62 and the electrical bridges 60 that integrally connect adjacent ground shields 36. The ground shield 36 along these portions 402 may or may not be plated. In at least one embodiment, the base material 204 is plated by the nickel plating layer 208 along the portions 402 outside of the contact segments 39, but these portions 402 lack the tin-nickel alloy plating layer 206. For example, the tin-nickel alloy plating layer 206 may only be located along the contact segments 39, while the nickel plating layer 208 may surround an entire surface area of the ground shield 36 (e.g., both along the contact segments 39 and the portions 402 outside of the contact segments 39).

In an alternative embodiment, the ground-material composition 202 may be plated only along the mating segment 37 or only along the mounting segment 62, but not both. For example, the ground-material composition 202 may be plated along the mating segment 37 and the mounting segment 62 may have a plating composition that differs from the ground-material composition 202 shown in FIG. 5. In a non-limiting example, the base material along the mounting segment 62 may be plated with an intermediate layer of nickel and then an outer layer of tin (e.g., not a tin-nickel alloy). In another alternative embodiment, the ground-material composition 202 may be plated along the entire ground shield 36, including the portions 402 outside of the contact segments 39.

Figure 8:
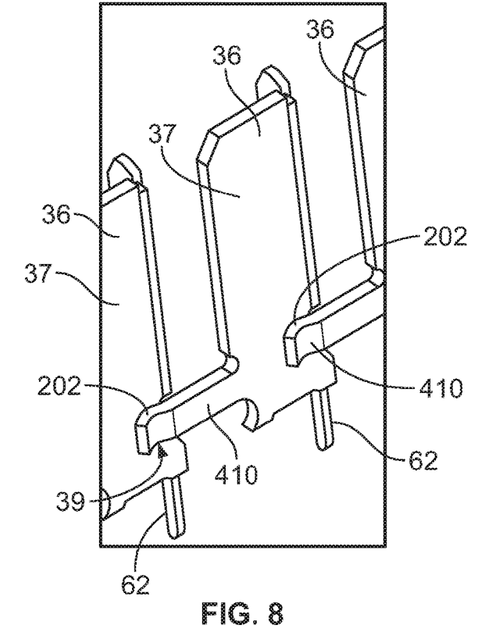
FIG. 8 is a perspective view of multiple ground shields of the header connector according to an alternative embodiment.

FIG. 8 is a perspective view of multiple ground shields 36 of the header connector 14 according to an alternative embodiment. The ground shields 36 shown in FIG. 8 are aligned in a row. The ground shields 36 differ from the ground shields 36 shown in FIGS. 3 and 7 because the ground shields 36 in FIG. 8 are not integrally connected by electrical bridges 60. Instead, the ground shields 36 are discrete parts that have coupling segments 410 that engage adjacent ground shields 36 via compression engagement. In the illustrated embodiment, the coupling segments 410 are spring beams that extend parallel to the row and engage an outer surface of an adjacent ground shield 36 in the row. Optionally, all or at least some of the ground shields 36 have a single coupling segment 410 that extend in a common direction to mechanically link and electrically connect the ground shields 36 in the row without chemical bonding or fasteners. The coupling segments 410 represent contact segments 39 and may be plated with the ground-material composition 202 as shown in FIGS. 5 and 7. For example, the entire coupling segment 410 or at least the portion that engages the adjacent ground shield 36 may be plated with the ground-material composition 202 in addition to, or instead of, plating the mating segment 37 and/or the mounting segment 62 with the ground-material composition 202. In a non-limiting example embodiment, the mating segment 37, the mounting segment 62, and the coupling segment 410 are all plated with the ground-material composition 202, such that these segments 37, 62, 410 include the tin-nickel alloy plating layer 206 shown in FIG. 5.

Although FIGS. 5, 7, and 8 show the ground-material composition 202 plated on the ground shields 36 of the header connector 14, the ground-material composition 202 may be plated on the ground shields 32 of the receptacle connector 12 in addition to the ground shields 36 of the header connector 14. For example, the description referring to FIGS. 5, 7, and 8 may apply to the ground shields 32 of the receptacle connector 12. The contact segments 33 (shown in FIG. 2) of the ground shields 32 may be plated in the ground-material composition 202, such that the mating segments 34 (FIG. 2) and/or the mounting segments 52 (FIG. 2) are plated with at least one intermediate plating layer and then by an outer plating layer that is a tin-nickel alloy and represents the outermost metal layer. The intermediate plating layer may be a nickel plating layer. In an alternative embodiment, the ground-material composition 202 is plated on the ground shields 32 of the receptacle connector 12 instead of the ground shields 36 of the header connector 14, such that the ground shields 36 of the header connector 14 may have a different plating composition than the ground-material composition 202.

Furthermore, although FIG. 6 shows the signal-material composition 302 plated on the signal contact 30 of the header connector 14, the signal-material composition 302 may be plated on the signal contacts 28 of the receptacle connector 12 in addition to the signal contacts 30 of the header connector 14. In an alternative embodiment, the signal-material composition 302 is plated on the signal contacts 28 of the receptacle connector 12 and not on the signal contacts 30 of the header connector 14.

Although described and illustrated herein with respect to the receptacle and header connectors 12 and 14, the embodiments described and/or illustrated herein are not limited to specific electrical connectors, but rather may be used with any other type of electrical connector, such as, but not limited to, cable connectors, other types of circuit board connectors, and/or the like.

The embodiments described and/or illustrated herein may reduce the cost of plating ground contacts without sacrificing electrical performance of an electrical connector that includes the ground contacts. The embodiments described and/or illustrated herein may provide an electrical connector that is less expensive to manufacture for a given electrical performance.

The embodiments described herein disclose a ground-material composition plated on ground shields, which are conductors that convey ground (or return) current. The ground-material composition includes a tin-nickel alloy plating layer that remains stable in an acceptable resistance range throughout the expected lifetime of the electrical connector. The tin-nickel allow plating layer may contain between about 55 wt % and about 75 wt % of tin and between about 25 wt % and 45 wt % of nickel. In a particular embodiment, the tin-nickel alloy contains 65 wt % of tin and 35 wt % of nickel. The ground-material composition having the tin-nickel alloy plating layer may produce a contact resistance below 1 ohm upon initial mating, and remains relatively stable within an acceptable resistance range less than 10 ohms throughout the expected lifespan. In addition to reducing cost over ground shields that have precious metal platings, the ground-material composition disclosed herein may maintain performance characteristics even with low normal forces, such as 0.1 N or less.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely example embodiments. Many other embodiments and modifications within the spirit and scope of the claims will be apparent to those of ordinary skill in the art upon reviewing the above description. The scope of the invention should, therefore, be determined with reference to the appended claims, along with the full scope of equivalents to which such claims are entitled.

In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. An electrical connector comprising:
a housing;
signal contacts coupled to the housing and positioned for mating with mating signal contacts of a mating connector; and
ground shields coupled to the housing and at least partially surrounding the signal contacts to shield the signal contacts;
wherein the ground shields are plated with a ground-material composition along one or more contact segments of the ground shields that come into compression engagement with one or more other conductive members, the ground-material composition including a tin-nickel (Sn/Ni) alloy plating layer, and wherein the signal contacts are plated with a signal-material composition that is different than the ground-material composition.

2. The electrical connector of claim 1, wherein the ground-material composition along a mating contact segment of the ground shields is configured to cause a first low-level contact resistance (LLCR) while mated with mating ground shields of the mating connector during operation, and the signal-material composition is configured to cause a second LLCR while mated with the mating signal contacts of the mating connector during operation, wherein the second LLCR is less than the first LLCR.

3. The electrical connector of claim 1, wherein the tin-nickel alloy plating layer contains between about 55 wt % and about 75 wt % of tin and between about 25 wt % and 45 wt % of nickel.

4. The electrical connector of claim 1, wherein the tin-nickel alloy plating layer contains about 65 wt % of tin and about 35 wt % of nickel.

5. The electrical connector of claim 1, wherein the ground shields lack the ground-material composition along portions of the ground shields outside of the one or more contact segments.

6. The electrical connector of claim 1, wherein the tin-nickel alloy plating layer is an outermost metal layer of the ground shields along the one or more contact segments.

7. The electrical connector of claim 1, wherein the ground-material composition includes a nickel plating layer between a base material of the ground shields and the tin-nickel alloy plating layer.

8. The electrical connector of claim 1, wherein the ground shields include a base material and a nickel plating layer covering the base material along an entire surface area of the ground shields, and wherein the tin-nickel alloy plating layer covers the nickel plating layer only along the one or more contact segments of the ground shields.

9. The electrical connector of claim 1, wherein the signal-material composition of the signal contacts lacks a tin-nickel alloy plating layer.

10. The electrical connector of claim 1, wherein the one or more contact segments of the ground shields include one or more of (i) mating segments of the ground shields that engage mating ground shields of the mating connector during mating, (ii) mounting segments of the ground shields that are press-fit into a conductive hole of a circuit board, or (iii) coupling segments of the ground shields that engage adjacent ground shields of the electrical connector.

11. An electrical connector comprising:
a housing;
signal contacts coupled to the housing and positioned for mating with mating signal contacts of a mating connector, the signal contacts having a plating layer that includes a precious metal; and
ground shields coupled to the housing and at least partially surrounding the signal contacts to shield the signal contacts, the ground shields having a plating layer that includes a tin-nickel alloy along one or more contact segments of the ground shields that come into compression engagement with one or more other conductive members,
wherein the ground shields lack the precious metal included in the plating layer of the signal contacts and the signal contacts lack the tin-nickel alloy included in the plating layer of the ground shields.

12. The electrical connector of claim 11, wherein the tin-nickel alloy in the plating layer of the ground shields contains between about 55 wt % and about 75 wt % of tin and between about 25 wt % and 45 wt % of nickel.

13. The electrical connector of claim 11, wherein the tin-nickel alloy in the plating layer of the ground shields contains about 65 wt % of tin and about 35 wt % of nickel.

14. The electrical connector of claim 11, wherein the plating layer of the ground shields that includes the tin-nickel alloy is an outermost metal layer of the ground shields along the one or more contact segments.

15. The electrical connector of claim 11, wherein the ground shields include a base material and a nickel plating layer covering the base material along an entire surface area of the ground shields, and wherein the plating layer including the tin-nickel alloy covers the nickel plating layer only along the one or more contact segments of the ground shields.

16. The electrical connector of claim 11, wherein the one or more contact segments of the ground shields that have the plating layer including the tin-nickel alloy include one or more of (i) mating segments of the ground shields that engage mating ground shields of the mating connector during mating, (ii) mounting segments of the ground shields that are press-fit into a conductive hole of a circuit board, and (iii) coupling segments of the ground shields that engage adjacent ground shields of the electrical connector.

17. The electrical connector of claim 11, wherein the precious metal in the plating layer of the signal contacts is one of gold, silver, platinum, or palladium.

18. A connector system comprising:
a mating connector having mating signal contacts and mating ground shields; and
an electrical connector comprising:
a housing;
signal contacts coupled to the housing and positioned for mating with the mating signal contacts of the mating connector at signal interfaces; and
ground shields coupled to the housing and at least partially surrounding the signal contacts to shield the signal contacts, the ground shields having mating segments positioned for mating with the mating ground shields of the mating connector at ground interfaces;
wherein the mating segments of the ground shields are plated with a ground-material composition and the signal contacts are plated with a signal-material composition that is different than the ground-material composition, the ground-material composition including a nickel plating layer that covers a base material of the ground shields and a tin-nickel (Sn/Ni) alloy plating layer that covers the nickel plating layer.

19. The connector system of claim 18, wherein the ground interfaces have a first low-level contact resistance (LLCR) and the signal interfaces have a second LLCR, the second LLCR being less than the first LLCR.

20. The connector system of claim 18, wherein the tin-nickel alloy plating layer contains between about 55 wt % and about 75 wt % of tin and between about 25 wt % and 45 wt % of nickel.

* * * * *